(12) United States Patent
Lee et al.

(10) Patent No.: US 8,576,600 B2
(45) Date of Patent: Nov. 5, 2013

(54) SEMICONDUCTOR MEMORY DEVICE AND OPERATING METHOD THEREOF

(75) Inventors: Jung Hwan Lee, Suwon-si (KR); Seong Je Park, Suwon-si (KR); Ji Hwan Kim, Seoul (KR); Myung Cho, Icheon-si (KR); Beom Seok Hah, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 49 days.

(21) Appl. No.: 13/420,038

(22) Filed: Mar. 14, 2012

(65) Prior Publication Data
US 2012/0236618 A1 Sep. 20, 2012

(30) Foreign Application Priority Data

Mar. 15, 2011 (KR) ........................ 10-2011-0022778

(51) Int. Cl.
*G11C 15/00* (2006.01)
(52) U.S. Cl.
USPC ........................................ 365/49.17; 365/201
(58) Field of Classification Search
USPC .............................................. 365/49.17, 201
See application file for complete search history.

(56) References Cited

U.S. PATENT DOCUMENTS 5,606,523 A * 2/1997 Mirabel .................... 365/185.05
6,307,787 B1 * 10/2001 Al-Shamma et al. ..... 365/185.33

FOREIGN PATENT DOCUMENTS

KR 1020120061561 A 6/2012

* cited by examiner

*Primary Examiner* — Michael Tran
(74) *Attorney, Agent, or Firm* — William Park & Associates Patent Ltd.

(57) ABSTRACT

A semiconductor memory device includes a memory array configured to include memory cells for storing input data and Code Address Memory (CAM) cells for storing setting data used to set an operation condition; an operation circuit configured to perform a CAM read operation by supplying a read voltage to the CAM cells, perform a test operation for detecting unstable CAM cells in each of which a difference between a threshold voltage and the read voltage is smaller than a permitted limit, from among the CAM cells, and perform an erase operation or a program operation for the unstable CAM cells; and a controller configured to control the operation circuit so that the program operation for storing the setting data in the unstable CAM cells is performed if the number of unstable CAM cells detected in the test operation is greater than a permitted value.

20 Claims, 7 Drawing Sheets

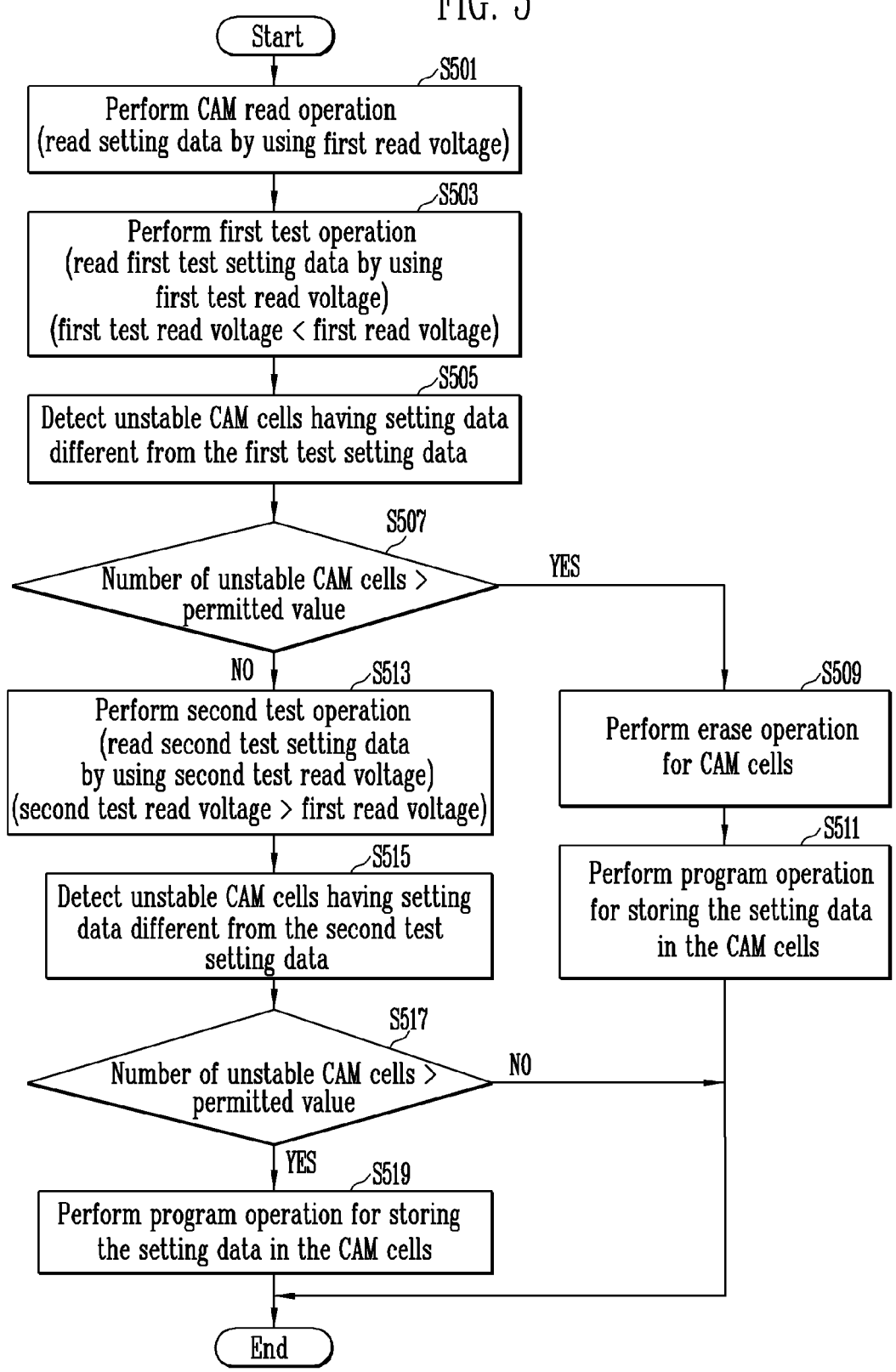

SEMICONDUCTOR MEMORY DEVICE AND OPERATING METHOD THEREOF

CROSS-REFERENCE TO RELATED APPLICATION

The present application claims priority under 35 U.S.C. 119(a) to Korean patent application number 10-2011-0022778 filed on Mar. 15, 2011, in the Korean intellectual property office the entire disclosure of which is incorporated by reference herein.

BACKGROUND

1. Technical Field

The present invention generally relates to a semiconductor memory device and an operating method thereof and, more particularly, to a semiconductor memory device including non-volatile memory cells and an operating method thereof.

2. Related Art

Semiconductor memory devices have varying operating characteristics although they are fabricated under the same condition. For this reason, after semiconductor memory devices are fabricated, a test operation is performed in order to check operating characteristics of the semiconductor memory devices. Operating voltages of the semiconductor memory devices are determined based on the checked operating characteristics. Furthermore, the address of a failed memory cell or a failed memory block is checked through the test operation.

This information (hereinafter referred to as 'operation setting information') is stored in a non-volatile memory block, such as a Code Address Memory (hereinafter referred to as a 'CAM') block or an extra block. When power starts are supplied to the semiconductor memory device, a CAM read operation for reading the operation setting information stored in the CAM block is first performed. Next, an operating voltage having a preset level is generated based on operation setting information that is read from the CAM, and all operations are controlled so that a failed memory block is not used.

The operation setting information is stored in the CAM block through a program operation. The threshold voltages of CAM cells included in the CAM block vary depending on a data value of the operation setting information. In order to increase the data storage capacity, 2 bits of data are stored in each memory cell for storing data. For improved operational stability and reliable operation setting information, 1 bit of data is stored in each of the CAM cells. That is, the CAM cells may be divided into CAM cells of an erase state in which the threshold voltage is lower than 0 V and CAM cells of a program state in which the threshold voltage is higher than 0 V depending on a data value of the operation setting information. Furthermore, in a CAM read operation, a read voltage which is higher than the threshold voltages of the CAM cells of the erase state, but lower than the threshold voltages of the CAM cells of the program state is supplied to selected CAM cells. On the other hand, a pass voltage for turning on unselected CAM cells may be supplied to the unselected CAM cells regardless of their threshold voltages.

In order to perform a CAM read operation whenever power is supplied to the semiconductor memory device, the read voltage and the pass voltage are supplied to the CAM cells. Accordingly, the threshold voltage of the CAM cell is shifted by an interference phenomenon. That is, the threshold voltage of the CAM cell of the erase state is increased, but the threshold voltage of the CAM cell of the program state is lowered. If the threshold voltage of the CAM cell is greatly shifted as described above, the threshold voltage of the CAM cell of the erase state may become higher than the read voltage or the threshold voltage of the CAM cell of the program state may become lower than the read voltage, resulting in an error.

BRIEF SUMMARY

According to an embodiment, a change of operation setting information and an error in the operation can be prevented by detecting a shift in the threshold voltages of memory cells in which the operation setting information is stored and read-justing the threshold voltages of the memory cells based on the result of the detection.

A semiconductor memory device according to an aspect of the present disclosure includes a memory array configured to include memory cells for storing input data and Code Address Memory (CAM) cells for storing setting data used to set an operation condition; an operation circuit configured to perform a CAM read operation by supplying a read voltage to the CAM cells, perform a test operation for detecting unstable CAM cells in each of which a difference between a threshold voltage and the read voltage is smaller than a permitted limit, from among the CAM cells, and perform an erase operation or a program operation for the unstable CAM cells; and a controller configured to control the operation circuit so that the program operation for storing the setting data in the unstable CAM cells is performed if the number of unstable CAM cells detected in the test operation is greater than a permitted value.

An operating method of the semiconductor memory device according to another aspect of the present disclosure includes performing a test operation for detecting unstable CAM cells in each of which a difference between a threshold voltage and a read voltage is smaller than a permitted limit, from among CAM cells; determining whether a number of unstable CAM cells detected in the test operation is greater than a permitted value; and changing the threshold voltages of the unstable CAM cells so that the difference between the threshold voltage and the read voltage is greater than the permitted limit, if the number of unstable CAM cells is greater than the permitted value.

A semiconductor memory device according to another embodiment includes an operation circuit configured to perform a test operation for detecting unstable CAM cells where CAM cells are memory cells for storing setting data that is used to set an operation condition, and where unstable CAM cells are CAM cells in which a difference between a threshold voltage and a read voltage is smaller than a permitted limit; and a second test operation for detecting second unstable CAM cells, each having a threshold voltage equal to or higher than the read voltage and having the difference between the threshold voltage and the read voltage smaller than the permitted limit.

BRIEF DESCRIPTION OF THE DRAWINGS

FIG. 5 is a flowchart illustrating an operating method of the semiconductor memory device according to an example embodiment of this disclosure.

DESCRIPTION OF EMBODIMENTS

Hereinafter, some example embodiments of the present disclosure will be described in detail with reference to the accompanying drawings. The figures are provided to allow those having ordinary skill in the art to understand the scope of the example embodiments of the disclosure.

Figure 1:
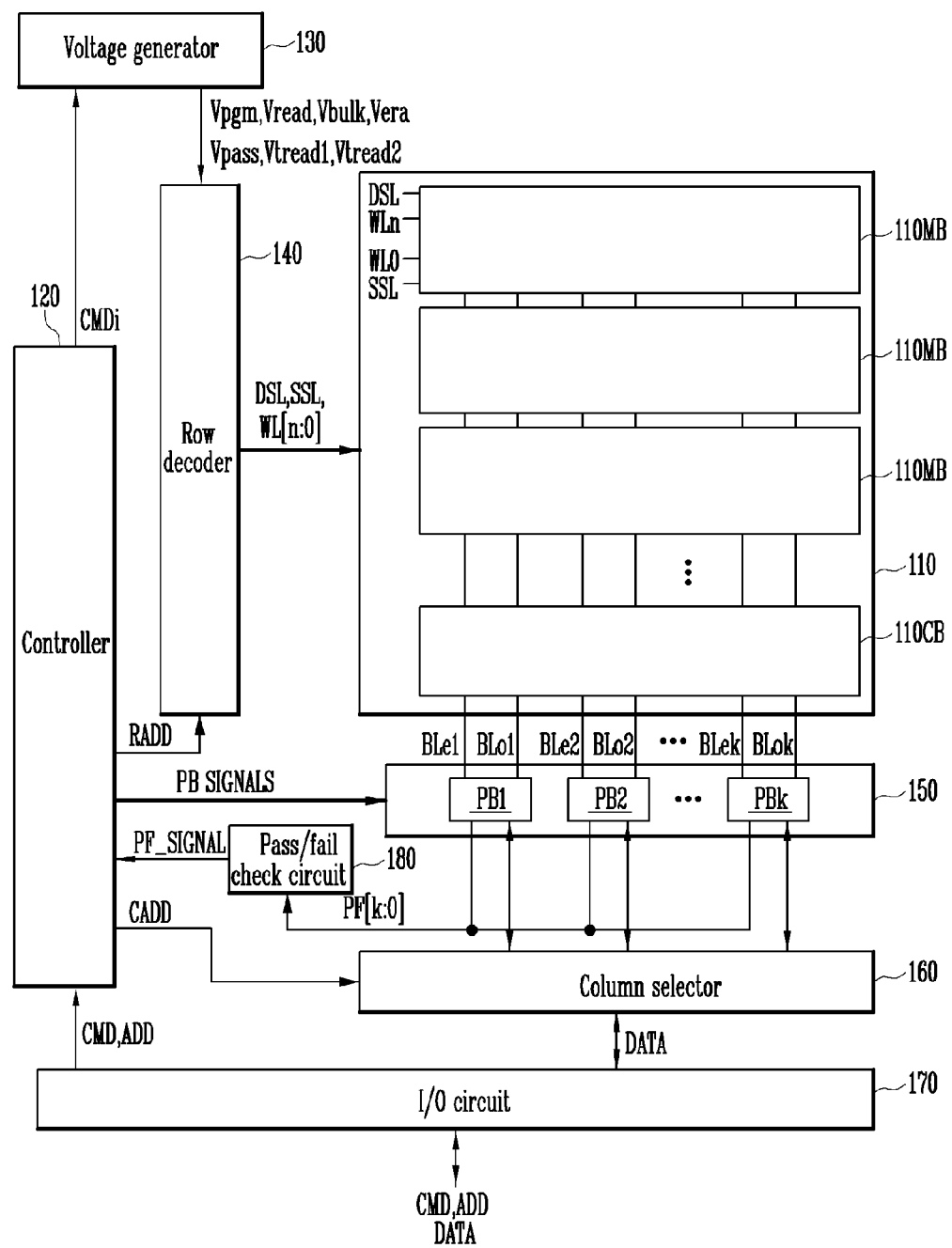
FIG. 1 is a circuit diagram of a semiconductor memory device according to an example embodiment of this disclosure.
Figure 2:
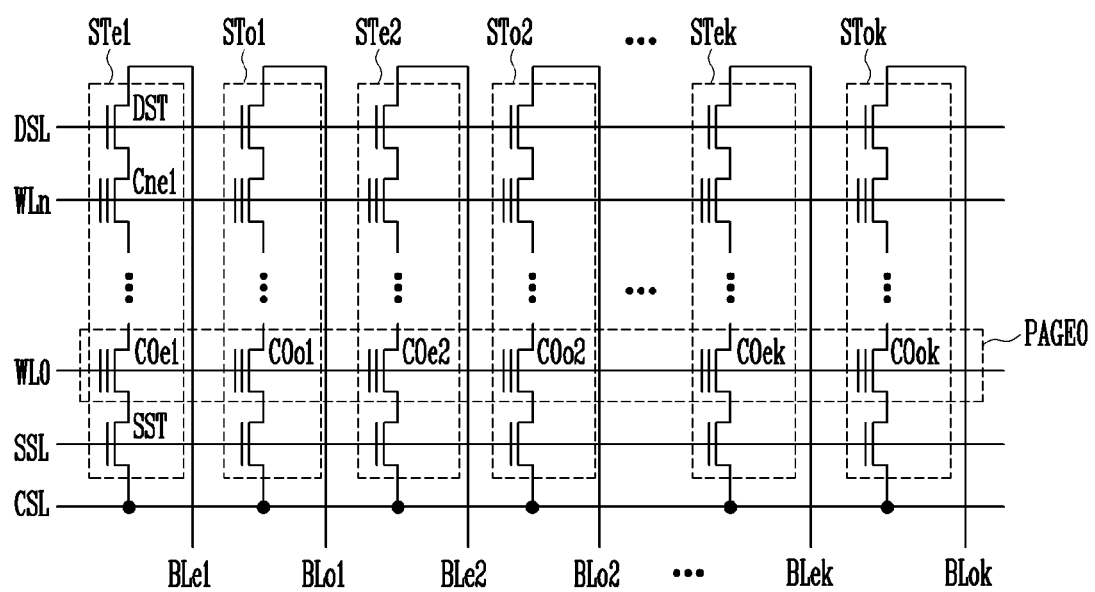
FIG. 2 is a circuit diagram of a CAM block shown in FIG. 1.

FIG. 1 is a circuit diagram of a semiconductor memory device according to an embodiment of this disclosure, and FIG. 2 is a circuit diagram of a CAM block shown in FIG. 1.

The semiconductor memory device according to an embodiment of this disclosure includes a memory array 110 configured to include a plurality of memory blocks 110MB. The semiconductor memory device may also include an operation circuit configured to perform a program operation and a read operation (or a verify operation) for memory cells included in a page of the memory block 110MB and to perform a test operation for detecting unstable cells in the memory cells. The semiconductor memory device may further include a controller 120 configured to control the operation circuit. If the semiconductor memory device is a NAND flash memory device, the operation circuit includes a voltage supply circuit, page buffer group 150, a column selector 160, an I/O circuit 170, and a path/fail check circuit 180.

The memory array 110 includes the plurality of memory blocks 110MB and one or more CAM blocks 110CB. The CAM block 110CB stores setting data used to set operation conditions and may have the same configuration as the memory block 110MB.

Referring to FIG. 2, each of the memory blocks 110MB includes a plurality of strings STe1 to STek, STo1 to STok coupled between respective bit lines BLe1 to BLek, BLo1 to Blok and a common source line CSL. More specifically, the strings STe1 to STek, STo1 to STok are coupled to the respective bit lines BLe1 to BLek, BLo1 to Blok and are in common coupled to the common source line CSL. Each of the strings (e.g., STe1) includes a source select transistor SST having a source coupled to the common source line CSL, a plurality of memory cells C0e1 to Cne1, and a drain select transistor DST having a drain coupled to the bit line BLe1. The memory cells C0e1 to Cne1 are coupled in series between the select transistors SST and DST. A gate of the source select transistor SST is coupled to a source select line SSL, the gates of the memory cells C0e1 to Cne1 are coupled to respective word lines WL0 to WLn, and a gate of the drain select transistor DST is coupled to the drain select line DSL.

In a NAND flash memory device, memory cells of the memory block may be divided by physical page or logical page. For example, the memory cells C0e1 to C0ek, C0o1 to C0ok coupled to a word line (e.g., WL0) may form a physical page PAGE0. Furthermore, even-numbered memory cells C0e1 to C0ek coupled to the word line WL0 may form an even physical page, odd-numbered memory cells C0o1 to C0ok coupled to the word line WL0 may form an odd physical page. The page (or the even page or the odd page) is a basic unit for a program operation or a read operation.

Referring to FIGS. 1 and 2, the controller 120 performs a program operation, a read operation, or an erase operation, or the controller 120 generates an internal command signal CMDi for performing a CAM read operation and a test operation in response to a command signal CMD externally received via the I/O circuit 170, and the controller 120 generates PB control signals PB SIGNALS for controlling the page buffers PB1 to PBk of the page buffer group 150 depending on a type of an operation. An operation of the controller 120 controlling the page buffer group 150 is described later. The controller 120 further generates a row address signal RADD and a column address signal CADD in response to an address signal ADD externally received via the I/O circuit 170.

The voltage supply circuit supplies the drain select line DSL, the word lines WL0 to WLn, and the source select line SSL of a selected memory block (or a selected CAM block) with operating voltages Vpgm, Vread, and Vpass necessary for the program operation or the read operation (i.e., the CAM read operation) for memory cells or test read voltages Vtread1 and Vtread2 necessary for the test operation for detecting failed CAM cells, where the operations are performed in response to the internal command signal CMDi of the controller 120. The voltage supply circuit includes a voltage generator 130 and a row decoder 140.

The voltage generator 130 outputs the operating voltages necessary for the program operation, the read operation, the erase operation, or the test operation of memory cells to global lines in response to internal command signal CMDi. For example, for the program operation, the voltage generator 130 may output, to the global lines, the program voltage Vpgm to be supplied to the memory cells of a selected page, and the voltage generator 130 may output the pass voltage Vpass to be supplied to unselected memory cells. For the read operation, the voltage generator 130 may output, to the global lines, the read voltage Vread to be supplied to the memory cells of a selected page, and the voltage generator 130 may output the pass voltage Vpass to be supplied to unselected memory cells. For the erase operation, the voltage generator 130 may output the erase voltage Vera and the bulk voltage Vbulk to be supplied to the memory cells of a selected memory block to the global lines and the bulk (or the well or the P-well) of the memory cells, respectively. In particular, in the test operation for detecting unstable CAM cells, the voltage generator 130 outputs the test read voltages Vtread1 and Vtread2 to the global lines where the read voltages Vtread1 and Vtread2 may be supplied to the CAM cells of a selected CAM block.

The row decoder 140 couples the global lines and the local lines DSL, WL0 to WLn, and SSL in response to the row address signals RADD received from the controller 120 so that the operating voltages generated from the voltage generator 130 are transferred to the local lines DSL, WL0 to WLn, and SSL of the memory block 110MB or the CAM block 110CB of the memory array 110. Thus, the program voltage Vpgm, the read voltage Vread, the erase voltage Vera, or the test read voltage Vtread1 or Vtread2 generated from the voltage generator 130 is supplied to a local word line (e.g., WL0), coupled to a selected cell (e.g., Ca0), via a global word line. Furthermore, the pass voltage Vpass generated from the voltage generator 130 is supplied to local word lines (e.g., WL1 to WLn) via global word lines, where the local word lines (e.g., WL1 to WLn) are coupled to unselected cells (e.g., C1e1 to Cne1). In the erase operation, the erase voltage Vera may be supplied to all the memory cells of a relevant block. Accordingly, data is stored in the selected cell C0e1 by using the program voltage Vpgm, data stored in the selected cell C0e1 is read by using the read voltage Vread, and data for a test is read from the selected cell C0e1 by using the test read voltage Vtread1 or Vtread2.

The page buffer group 150 includes the plurality of page buffers PB1 to PBk coupled to the memory array 110 through the bit lines BLe1 to BLek, BLo1 to BLok. The page buffers PB1 to PBk of each of the page buffer groups 150 selectively precharge the bit lines BLe1 to BLek or BLo1 to BLok based on received input data in order to store the input data in the memory cells C0e1 to C0ek or C0o1 to C0ok, or the page buffers PB1 to PBk of each of the page buffer group 150 sense voltages of the bit lines BLe1 to BLek or BLo1 to BLok in order to read data from the memory cells C0e1 to C0ek or C0o1 to C0ok in response to the PB control signal PB_SIGNALS received from the controller 120. For example, in a program operation, when program data (e.g., data '0') to be stored in a targeted memory cell is received, a relevant page buffer supplies a program permission voltage (e.g., a ground voltage) to a bit line coupled to the memory cell. Furthermore, when erase data (e.g., data '1') to be stored in a memory cell is received, a relevant page buffer supplies a program inhibition voltage (e.g., a power source voltage) to a bit line coupled to the targeted memory cell.

In a read operation, the page buffer group 150 precharges all the odd bit lines BLo1 to Blok or all the even bit lines BLe1 to BLek. When the read voltage Vread is supplied from the voltage supply circuit to the memory cells of a selected page, bit lines coupled to memory cells in which program data is stored, from among the memory cells of the selected page, maintain a precharge state and bit lines coupled to memory cells in which erase data is stored, from among the memory cells of the selected page, are discharged. The page buffer group 150 detects a change in the voltages of the bit lines BLe1 to BLek or BLo1 to Blok and latches data of the memory cells corresponding to the result of the detection.

A detailed construction of the page buffer is described later.

The column selector 160 selects the page buffers PB1 to PBk of the page buffer group 150 in response to the column address signal CADD received from the controller 120. That is, the column selector 160 sequentially transfers data to be stored in memory cells to the page buffers PB1 to PBk in response to the column address signal CADD. Furthermore, the column selector 160 sequentially selects the page buffers PB1 to PBk in response to the column address signal CADD so that the data of memory cells latched in the page buffers PB1 to PBk is externally outputted through a read operation.

For a program operation, the I/O circuit 170 transfers external data to the column selector 160 under control of the controller 120 so that the external data is inputted to the page buffer group 150 in order to store the external data in memory cells. When the column selector 160 sequentially transfers the external data to the page buffers PB1 to PBk of the page buffer group 150, the page buffers PB1 to PBk store the received data in their internal latches. Furthermore, in a read operation, the I/O circuit 170 externally outputs data received from the page buffers PB1 to PBk of the page buffer group 150 via the column selector 160.

Figure 3:
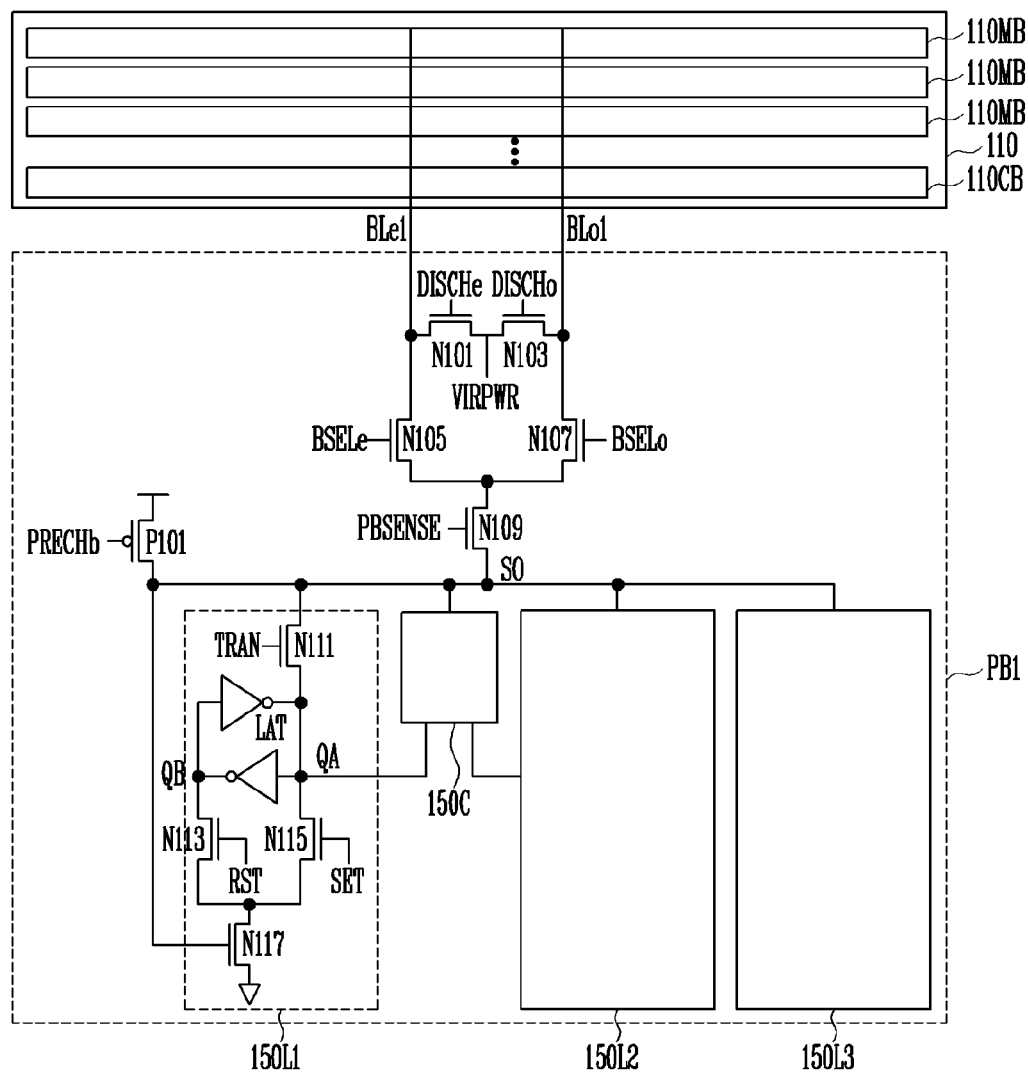
FIG. 3 is a circuit diagram of a page buffer shown in FIG. 1.

FIG. 3 is a circuit diagram of the page buffer shown in FIG. 1.

Referring to FIG. 3, the page buffer (e.g., PB1) operates under control of the controller 120. Signals PRECHb, TRAN, RST, SET, PBSENSE, BSELe, BSELo, DISCHe, and DISCHo, to be described below, may be generated from the controller 120.

The page buffer PB1 includes bit line select circuits N101, N103, N105, and N107, a bit line coupling circuit N109, a precharge circuit P101, a plurality of latch circuits 150L1 to 150L3, and a comparison circuit 150C.

The bit line select circuits N101, N103, N105, and N107 couple a bit line, selected from among the even bit line BLe1 and the odd bit line BLo1, to the page buffer PB1 in response to the bit line select signals BSELe and BSELo. The bit line select circuits N101, N103, N105, and N107 may also perform an operation of precharging or discharging unselected bit lines in response to the discharge signals DISCHe and DISCHo. If the bit line select circuits N101, N103, N105, and N107 are formed from switching elements that are joint or in common, the in common switching elements N101 and N103 precharge unselected bit lines in a program operation or discharge the unselected bit lines in a read operation, and the in common switching elements N105 and N107 couple a selected bit line to the page buffer PB1.

The bit line coupling circuit N109 couples the bit line BLe1 or BLo1, selected by the bit line select circuit N105 and N107, and one of the latch circuits 150L1 to 150L3 in response to the coupling signal PBSENSE. The latch circuits 150L1 to 150L3 are coupled in parallel to the bit line coupling circuit N109. A node of the bit line coupling circuit N109 and the latch circuits 150L1 to 150L3 is a sense node SO.

The precharge circuit P101 precharges the sense node SO in response to the precharge signal PRECHb.

The comparison circuit 150C compares data latched in the latch circuit 150L1 with data latched in the latch circuit 150L2 and outputs the result of the comparison to the sense node SO.

The number of latch circuits 150L1 to 150L3 may change depending on a design. The circuit diagram of FIG. 3 depicts only the three latch circuits 150L1 to 150L3 as an example. Other embodiments may include fewer or more latch circuits. Only one of the first to third latch circuits 150L1 to 150L3 is typically activated. The first latch circuit 150L1 may be used to latch data read from a memory cell through a read operation. The second latch circuit 150L2 may be used to latch data read from a memory cell through a test operation. The third latch circuit 150L3 may be used to latch the result of comparison outputted from the comparison circuit 150C.

Furthermore, one of the latch circuits 150L1 to 150L3 latches external data in a program operation and supplies a program inhibition voltage (e.g., a power source voltage) or a program permission voltage (e.g., a ground voltage) to a bit line based on the latched data.

The first latch circuit 150L1 is described as an example. The first latch circuit 150L1 includes a latch LAT configured to latch data, a switching element N111 configured to couple the first node QA of the latch LAT and the sense node SO in response to a transfer signal TRAN. The first latch circuit 150L1 may also include switching elements N115 and N113 coupled to the first and the second nodes QA and QB of the latch LAT and operated in response to a set signal SET and a reset signal RST, respectively. The first latch circuit 150L1 may further include a switching element N117 coupled between the switching elements N113 and N115 and a ground terminal and operated based on voltage of the sense node SO. For reference, the column selector 160 is coupled to the first and the second nodes QA and QB of the latch LAT which is included in the selected page buffer PB1, in response to the column address CADD.

Since signals having different waveforms are inputted to the latch circuits 150L2 and 150L3, only one of the latch circuits 150L1 to 150L3 is activated. Accordingly, the latch circuits 150L1 to 150L3 may perform different functions although the latch circuits 150L1 to 150L3 have the same construction.

Figure 4:
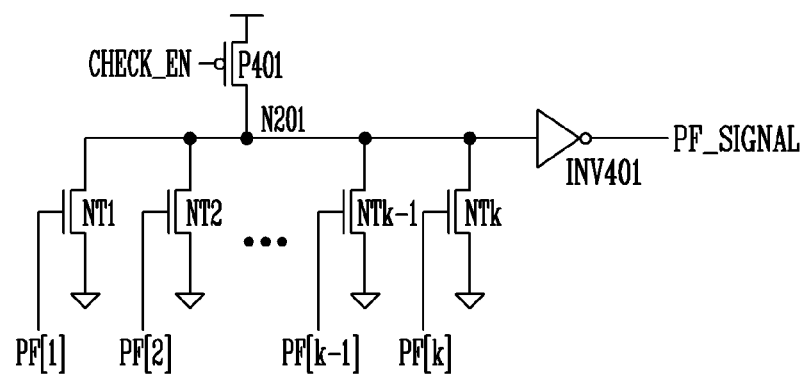
FIG. 4 is a circuit diagram of a pass/fail check circuit shown in FIG. 1.

FIG. 4 is a circuit diagram of the pass/fail check circuit 180 shown in FIG. 1.

Referring to FIG. 4, the pass/fail check circuit 180 includes a switching element P401 coupled between a power source voltage terminal and a node N201 and operated in response to a check enable signal CHECH_EN and switching elements NT1 to NTk. The switching elements NT1 to NTk may each be coupled in parallel between the node N201 and a ground terminal and operated in response to comparison result signals PF[1] to PF[k] respectively outputted from the third latch circuits of the page buffers. The pass/fail check circuit may further include an inverter INV401 for outputting a pass/fail check signal PF_SIGNAL based on voltage of the node N201.

If the number of bits of data not identical with each other is greater than a permitted value based on the comparison result signals PF[1] to PF[k] the pass/fail check circuit 180 generates the pass/fail check signal PF_SIGNAL. The comparison result signals PF[1] to PF[k] may correspond to the result of a comparison between data read by a read operation and data read by a test operation. Accordingly, it may be determined whether the number of unstable cells is greater than the permitted value, where the unstable cells are those in which a difference between the read voltage Vread supplied in the read operation and a threshold voltage is smaller than a permitted limit. An example in which the number of permitted values is 3 is described in detail below.

The switching elements NT1 to NTk are designed to have substantially the same size (or the same current driving ability), and the switching element P401 is designed to have a current driving ability three times greater than that of the switching element NT1. Furthermore, the number of bits of data in which data read by a read operation is not identical with data read by a test operation is 3 or less, only 3 or fewer switching elements of the switching elements NT1 to NTk are turned on, and thus three or fewer switching elements NT1 to NTk are connected to ground terminal. In this case, since the amount of current supplied from the power source voltage terminal to the node N201 via the switching element P401 is greater than the amount of current discharged from the node N201 to the ground terminal via the 3 or less switching elements, voltage of the node N201 maintains a high level, and the inverter INV401 generates the pass/fail check signal PF_SIGNAL of a disable state. On the other hand, if the number of bits of data not identical with each other exceeds 3, then more than 3 switching elements of the switching elements NT1 to NTk are turned on. Since the amount of current supplied from the power source voltage terminal to the node N201 via the switching element P401 is smaller than the amount of current discharged from the node N201 to the ground terminal via the more than 3 switching elements, voltage of the node N201 maintains a low level, and the inverter INV401 generates the pass/fail check signal PF_SIGNAL of an enable state.

An operating method of the semiconductor memory device configured as above is described below.

FIG. 5 is a flowchart illustrating an operating method of the semiconductor memory device according to an example embodiment of this disclosure, and FIGS. 6A through 6D are waveforms showing the threshold voltages of unstable CAM cells which are detected in a test operation of FIG. 5.

Figure 6A:
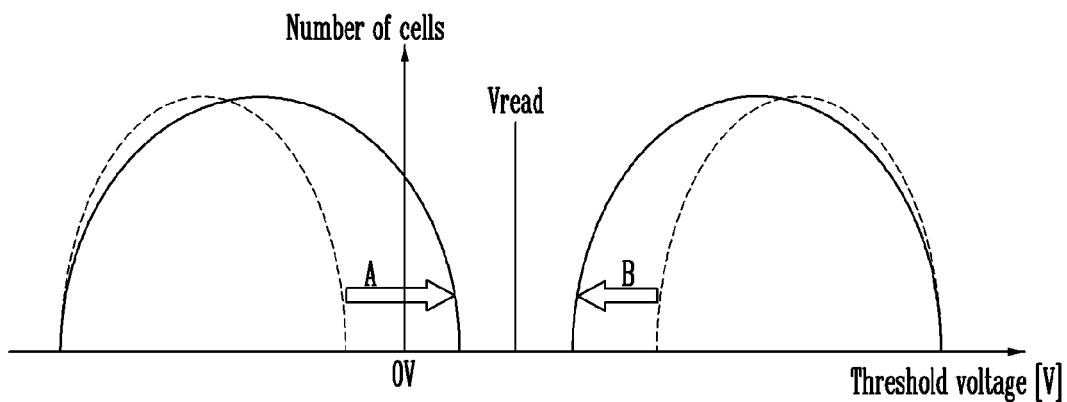
FIGS. 6A through 6D are waveforms showing threshold voltages of unstable CAM cells which are detected in a test operation of FIG. 5.

Referring to FIGS. 5 and 6A, since setting data of 1 bit is stored in each of the CAM cells, the threshold voltages of the CAM cells have two distributions. Furthermore, the threshold voltage distributions are divided by the read voltage Vread, and thus data stored in the CAM cells are detected.

The threshold voltages of the CAM cells having an erase state are lower than 0 V, but are raised because of a read disturbance phenomenon A which may occur due to the read voltage Vread or the pass voltage Vpass which are supplied to the CAM cells in frequent CAM read operations. As the CAM read operations are repeatedly performed, the read disturbance phenomenon A is accumulated, so that the threshold voltages become higher than 0 V and approach the read voltage Vread.

Furthermore, the threshold voltages of the CAM cells having a program state are higher than the read voltage Vread. If a long time elapses after the setting data is stored in the CAM cells, electrons injected into the CAM cells are discharged, so that the threshold voltages decrease (B) and approaches the read voltage Vread.

In order to detect the threshold voltages of the CAM cells, a CAM read operation is first performed at step S501. In order to perform the CAM read operation, the read voltage Vread is supplied to the CAM cells, and the setting data read from the CAM cells by using the read voltage Vread is latched in the first latch circuits of the page buffers of the page buffer group 150.

Figure 6B:
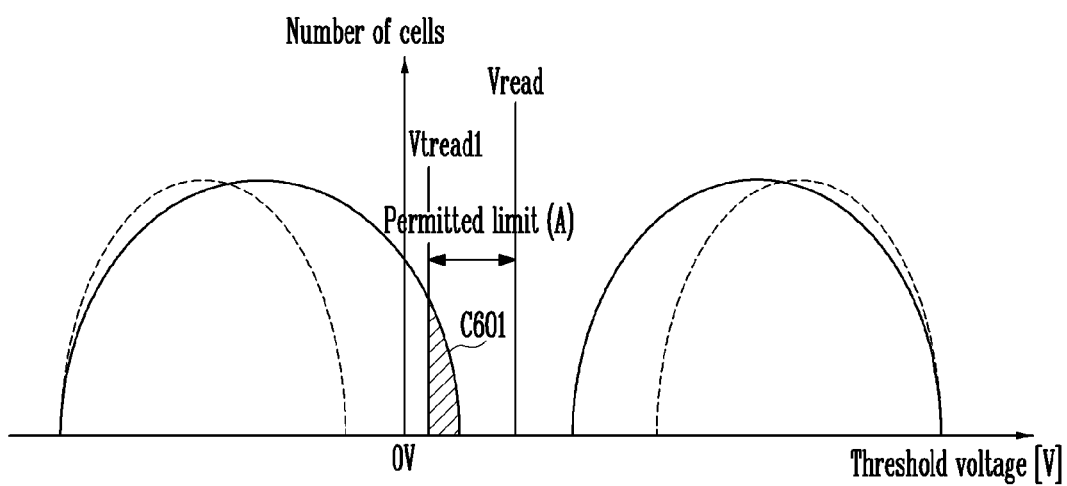

Referring to FIGS. 5 and 6B, a first test operation is performed at step S503. In the first test operation, a first test read voltage Vtread1 is supplied to the CAM cells, and first test setting data read by using the first test read voltage Vtread1 is latched in the second latch circuits of the page buffers of the page buffer group 150. The first test read voltage Vtread1 is lower than the read voltage Vread by the permitted limit represented by a permitted limit A.

At step S505, the threshold voltages of unstable CAM cells are detected. More specifically, the unstable CAM cells C601 having an erase state, but having the threshold voltages higher than the first test read voltage Vtread1 are detected as having a program state in the first test operation. Accordingly, setting data read from the unstable CAM cells C601 by a read operation may have different values from the first test setting data read from the CAM cells. Here, threshold voltages of the unstable CAM cells C601 have risen between the read voltage Vread and a permitted limit A due to a read disturbance phenomenon, where the permitted limit A illustrates a range bounded by the permitted limit and the read voltage Vread.

At step S507, it is determined whether the number of unstable CAM cells is larger than a permitted value. This operation is performed by the pass/fail check circuit 180.

If, as a result of the determination, the number of unstable CAM cells is larger than the permitted value, an erase operation is performed for the unstable CAM cells at step S509. Next, a program operation for storing the setting data in the unstable CAM cells is performed at step S511. Thus, a distribution of the threshold voltages of the unstable CAM cells of the erase state, shifted by the read disturbance phenomenon, returns to a normal distribution before the read disturbance phenomenon was generated. Furthermore, since the program operation is performed after the erase operation, a distribution of the threshold voltages of the unstable CAM cells of the program state, lowered by leakage, returns to a normal distribution before the leakage was generated. In this case, an additional test operation for detecting unstable CAM cells occurring due to the leakage can be omitted.

Figure 6C:
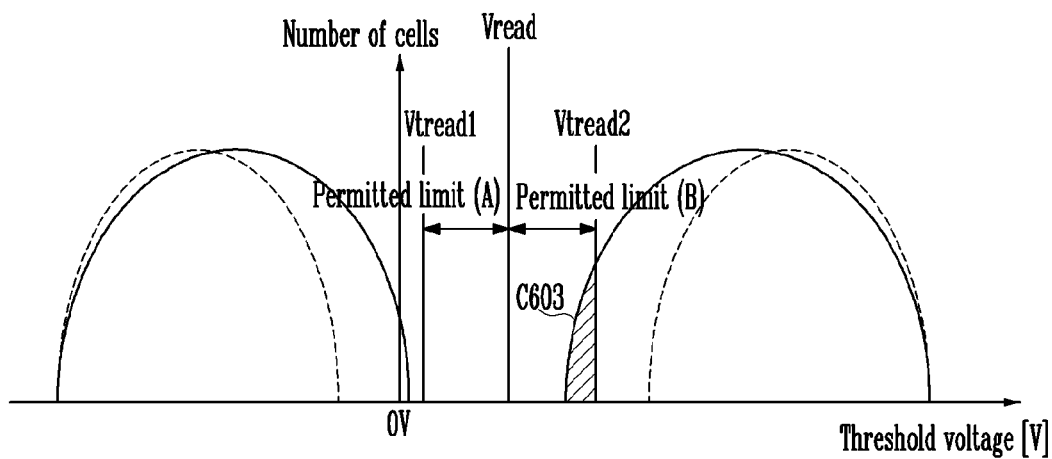

Referring to FIGS. 5 and 6C, if, as a result of the determination at step S507, the number of unstable CAM cells is equal to or smaller than the permitted value, a second test operation is performed at step S513. In the second test operation, a second test read voltage Vtread2 is supplied to the CAM cells, and second test setting data, read by using the second test read voltage Vtread2, is latched in the second latch circuits of the page buffers of the page buffer group 150. The second test read voltage Vtread2 is higher than the read voltage Vread by a permitted limit B where the permitted limit B is substantially the same as the permitted limit.

At step S515, the threshold voltages of unstable CAM cells are detected. More specifically, the unstable CAM cells C603 having a program state, but having threshold voltages lower than the second test read voltage Vtread2 are detected as having an erase state in the second test operation. Accordingly, the setting data read from the unstable CAM cells C603 by a read operation may have different values than the second test setting data read from the CAM cells. Here, the threshold voltages of the unstable CAM cells C603 have risen between the read voltage Vread and a voltage range bounded by the permitted limit B owing to a read disturbance phenomenon.

At step S517, it is determined whether the number of unstable CAM cells is larger than a permitted value. This operation is performed by the pass/fail check circuit 180. If, as a result of the determination, the number of unstable CAM cells C603 is equal to or smaller than the permitted value, the test operation is finished.

Figure 6D:
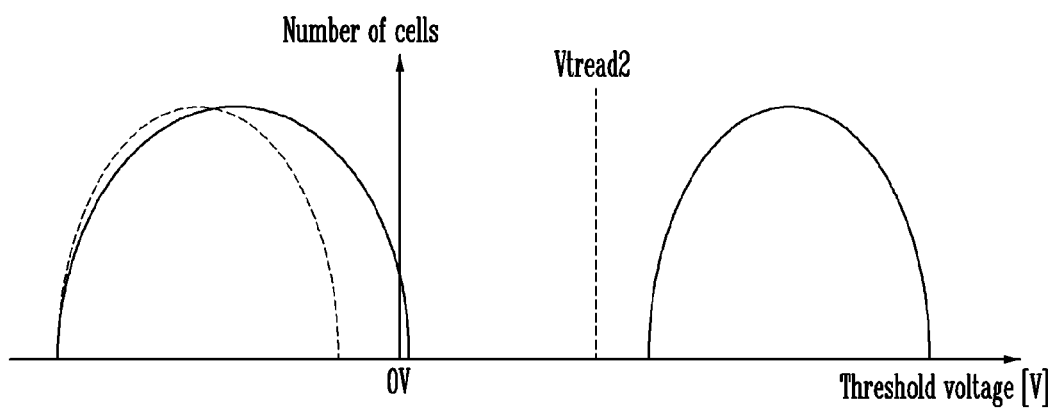

Referring to FIGS. 5 and 6D, if, as a result of the determination at step S517, the number of unstable CAM cells C603 is larger than the permitted value, a program operation for storing the setting data in the unstable CAM cells is performed at step S519. That is, the program operation is performed for the unstable CAM cells so that the threshold voltages of the unstable CAM cells, lowered less than the second test read voltage Vtread2, rise higher than the second test read voltage Vtread2. If unstable CAM cells having raised threshold voltages are not detected, or the number of unstable CAM cells having raised threshold voltages is equal to or smaller than the permitted value as the result of the first test operation, the erase operation for lowering the threshold voltages is unnecessary. Thus, only the program operation for the unstable CAM cells detected in the second test operation may be performed.

Accordingly, a distribution of the threshold voltages of the CAM cells of the program state, shifted by leakage, returns to a normal distribution before the leakage was generated.

In accordance with the example embodiments of this disclosure, a shift in the threshold voltages of memory cells is detected where operation setting information is stored in the memory cells, and the threshold voltages of the memory cells are readjusted based on the result of the detection. Accordingly, a change in the operation setting information and an error in operations can be prevented, such as read, program, verify and test operations, that may be performed on CAM or other memory cells.

What is claimed is:

1. A semiconductor memory device, comprising:
   a memory array configured to include memory cells for storing input data and Code Address Memory (CAM) cells for storing setting data used to set an operation condition;
   an operation circuit configured to perform a CAM read operation by supplying a read voltage to the CAM cells, perform a test operation for detecting unstable CAM cells in each of which a difference between a threshold voltage and the read voltage is smaller than a permitted limit, from among the CAM cells, and perform an erase operation or a program operation for the unstable CAM cells; and
   a controller configured to control the operation circuit so that the program operation for storing the setting data in the unstable CAM cells is performed if the number of unstable CAM cells detected in the test operation is greater than a permitted value.

2. The semiconductor memory device of claim 1, wherein the test operation comprises:
   a first test operation for detecting first unstable CAM cells by supplying the CAM cells with a first test read voltage lower than the read voltage by the permitted limit; and
   a second test operation for detecting second unstable CAM cells by supplying the CAM cells with a second test read voltage higher than the read voltage by the permitted limit.

3. The semiconductor memory device of claim 2, wherein the operation circuit compares first setting data, read from the CAM cells by the CAM read operation, with second setting data read from the CAM cells by the first test operation and detects CAM cells in which data bits not identical with each other are stored as the first unstable CAM cells.

4. The semiconductor memory device of claim 2, wherein the operation circuit compares first setting data, read from the CAM cells by the CAM read operation, with third setting data read from the CAM cells by the second test operation and detects CAM cells in which data bits not identical with each other are stored as the second unstable CAM cells.

5. The semiconductor memory device of claim 2, wherein, if a number of first unstable CAM cells detected in the first test operation is greater than the permitted value, the controller controls the operation circuit so that the erase operation is performed on the unstable CAM cells and the program operation for storing the setting data in the unstable CAM cells is then performed.

6. The semiconductor memory device of claim 2, wherein, if a number of first unstable CAM cells detected in the first test operation is greater than the permitted value, the controller controls the operation circuit so that the second test operation is not performed.

7. The semiconductor memory device of claim 2, wherein, if a number of first unstable CAM cells detected in the first test operation is equal to or smaller than the permitted value, the controller controls the operation circuit so that the second test operation is performed.

8. The semiconductor memory device of claim 7, wherein, if the number of second unstable CAM cells detected in the second test operation is greater than the permitted value, the controller controls the operation circuit so that the program operation for storing the setting data in the unstable CAM cells is performed.

9. The semiconductor memory device of claim 1, wherein the operation circuit comprises:
   a voltage supply circuit configured to supply the CAM cells with the read voltage, a first test read voltage lower than the read voltage by the permitted limit a second test read voltage higher than the read voltage by the permitted limit, erase voltages for the erase operation, and program voltages for the program operation;
   a page buffer group configured to include page buffers for comparing first setting data, read from the CAM cells using the read voltage, with second setting data read using the first test read voltage or third setting data read using the second test read voltage and for outputting comparison result data corresponding to the result of the comparison of the first setting data and the second setting data or third setting data; and
   a pass/fail check circuit configured to detect the comparison result data and generate a fail signal if the number of unstable CAM cells detected in the test operation is greater than the permitted value.

10. The semiconductor memory device of claim 9, wherein each of the page buffers comprises:
   a first latch circuit for latching the first setting data;
   a second latch circuit for latching the second setting data or the third setting data; and a third latch circuit for latching the first setting data of the first latch circuit and the second setting data of the second latch circuit or the comparison result data of the third setting data.

11. The semiconductor memory device of claim 1, wherein the operation circuit performs the CAM read operation whenever an external power source voltage is supplied and selectively performs the test operation under the control of the controller after the CAM read operation is performed.

12. An operating method of a semiconductor memory device, comprising:
    performing a test operation for detecting unstable Code Address Memory (CAM) cells in each of which a difference between a threshold voltage and a read voltage is smaller than a permitted limit, from among CAM cells;
    determining whether a number of unstable CAM cells detected in the test operation is greater than a permitted value; and
    changing the threshold voltages of the unstable CAM cells so that the difference between the threshold voltage and the read voltage is greater than the permitted limit, if the number of unstable CAM cells is greater than the permitted value.

13. The operating method of claim 12, wherein the test operation comprises:
    a first test operation for detecting first unstable CAM cells, each having a threshold voltage lower than the read voltage and having the difference between the threshold voltage and the read voltage smaller than the permitted limit; and
    a second test operation for detecting second unstable CAM cells, each having a threshold voltage equal to or higher than the read voltage and having the difference between the threshold voltage and the read voltage smaller than the permitted limit.

14. The operating method of claim 13, wherein the second test operation is not performed if a number of first unstable CAM cells detected in the first test operation is greater than the permitted value.

15. The operating method of claim 13, wherein if the number of first unstable CAM cells detected in the first test operation is greater than the permitted value, an erase operation is performed on the unstable CAM cells and a program operation is performed for storing setting data in the unstable CAM cells.

16. The operating method of claim 13, wherein if the number of second unstable CAM cells detected in the second test operation is greater than the permitted value, a program operation is performed for storing setting data in the unstable CAM cells.

17. A semiconductor memory device, comprising:
    an operation circuit configured to perform a test operation for detecting unstable Code Address Memory (CAM) cells where CAM cells are memory cells for storing setting data that is used to set an operation condition, and where unstable CAM cells are CAM cells in which a difference between a threshold voltage and a read voltage is smaller than a permitted limit; and
    the operation circuit is configured to receive commands for performing a program operation for storing the setting data in the unstable CAM cells if a number of unstable CAM cells detected in the test operation is greater than a permitted value.

18. The semiconductor memory device of claim 17, wherein the test operation further comprises:
    a first test operation for detecting first unstable CAM cells by supplying the CAM cells with a first test read voltage, where the first test read voltage is lower than the read voltage by the permitted limit; and
    a second test operation for detecting second unstable CAM cells by supplying the CAM cells with a second test read voltage higher than the read voltage by the permitted limit.

19. The semiconductor memory device of claim 18, wherein if the number of first unstable CAM cells detected in the first test operation is greater than the permitted value, the operation circuit performs an erase operation for the unstable CAM cells and performs the program operation for storing the setting data in the unstable CAM cells.

20. The semiconductor memory device of claim 18, wherein, if the number of first unstable CAM cells detected in the first test operation is equal to or smaller than the permitted value, the operation circuit performs the second test operation.

* * * * *